(12) United States Patent
Kim et al.

(10) Patent No.: US 11,749,653 B2
(45) Date of Patent: Sep. 5, 2023

(54) MULTI-DIE, VERTICAL-WIRE PACKAGE-IN-PACKAGE APPARATUS, AND METHODS OF MAKING SAME

(71) Applicant: Intel Corporation, Santa Clara, CA (US)

(72) Inventors: Hyoung Il Kim, Folsom, CA (US); Florence R. Pon, Folsom, CA (US); Yi Elyn Xu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 16/647,372

(22) PCT Filed: Dec. 28, 2017

(86) PCT No.: PCT/US2017/068780
§ 371 (c)(1),
(2) Date: Mar. 13, 2020

(87) PCT Pub. No.: WO2019/132933
PCT Pub. Date: Jul. 4, 2019

(65) Prior Publication Data
US 2021/0288034 A1    Sep. 16, 2021

(51) Int. Cl.
*H01L 25/10* (2006.01)
*H01L 23/00* (2006.01)
(Continued)

(52) U.S. Cl.
CPC ............ *H01L 25/105* (2013.01); *H01L 24/32* (2013.01); *H01L 24/49* (2013.01); *H01L 24/73* (2013.01); *H01L 24/85* (2013.01); *H01L 25/0657* (2013.01); *H01L 25/50* (2013.01); *H01L 2224/32145* (2013.01);
(Continued)

(58) Field of Classification Search
CPC .................. H01L 2225/06562; H01L 25/0657
See application file for complete search history.

(56) References Cited

U.S. PATENT DOCUMENTS

| 10,276,545 B1* | 4/2019 | Huang ..................... H01L 24/92 |
| 2010/0193930 A1* | 8/2010 | Lee ...................... H01L 23/5389 |
| | | 257/686 |

(Continued)

FOREIGN PATENT DOCUMENTS

| KR | 20100034564 A | 4/2010 |
| WO | WO-2019132933 A1 | 7/2019 |

OTHER PUBLICATIONS

"International Application Serial No. PCT/US2017/068780, International Search Report dated Sep. 27, 2018", 3 pgs.

(Continued)

*Primary Examiner* — Yu-Hsi D Sun
(74) *Attorney, Agent, or Firm* — Schwegman Lundberg & Woessner, P.A.

(57) ABSTRACT

A vertical-wire package-in-package includes at least two memory-die stacks that form respective memory modules that are stacked vertically on a bond-wire board. Each memory die in the memory-die stack includes a vertical bond wire that emerges from a matrix for connection. The matrix encloses the memory-die stack, the spacer, and a redistribution layer. At least two memory modules are assembled in a vertical-wire package-in-package.

12 Claims, 12 Drawing Sheets

(51) Int. Cl.
*H01L 25/065* (2023.01)
*H01L 25/00* (2006.01)

(52) U.S. Cl.
CPC ............... *H01L 2224/4901* (2013.01); *H01L 2224/4905* (2013.01); *H01L 2224/49107* (2013.01); *H01L 2224/73265* (2013.01); *H01L 2225/0651* (2013.01); *H01L 2225/06562* (2013.01); *H01L 2225/1017* (2013.01); *H01L 2225/1052* (2013.01)

(56) References Cited

U.S. PATENT DOCUMENTS

| 2012/0007227 A1* | 1/2012 | Cho ................ H01L 24/96 257/686 |
| 2014/0141566 A1 | 5/2014 | Schuetz et al. |
| 2017/0103968 A1 | 4/2017 | Prabhu et al. |
| 2017/0186737 A1 | 6/2017 | Fang et al. |
| 2017/0278821 A1 | 9/2017 | Zhao et al. |

OTHER PUBLICATIONS

"International Application Serial No. PCT/US2017/068780, Written Opinion dated Sep. 27, 2018", 8 pgs.
"International Application Serial No. PCT US2017 068780, International Preliminary Report on Patentability dated Jul. 9, 2020", 10 pgs.

* cited by examiner

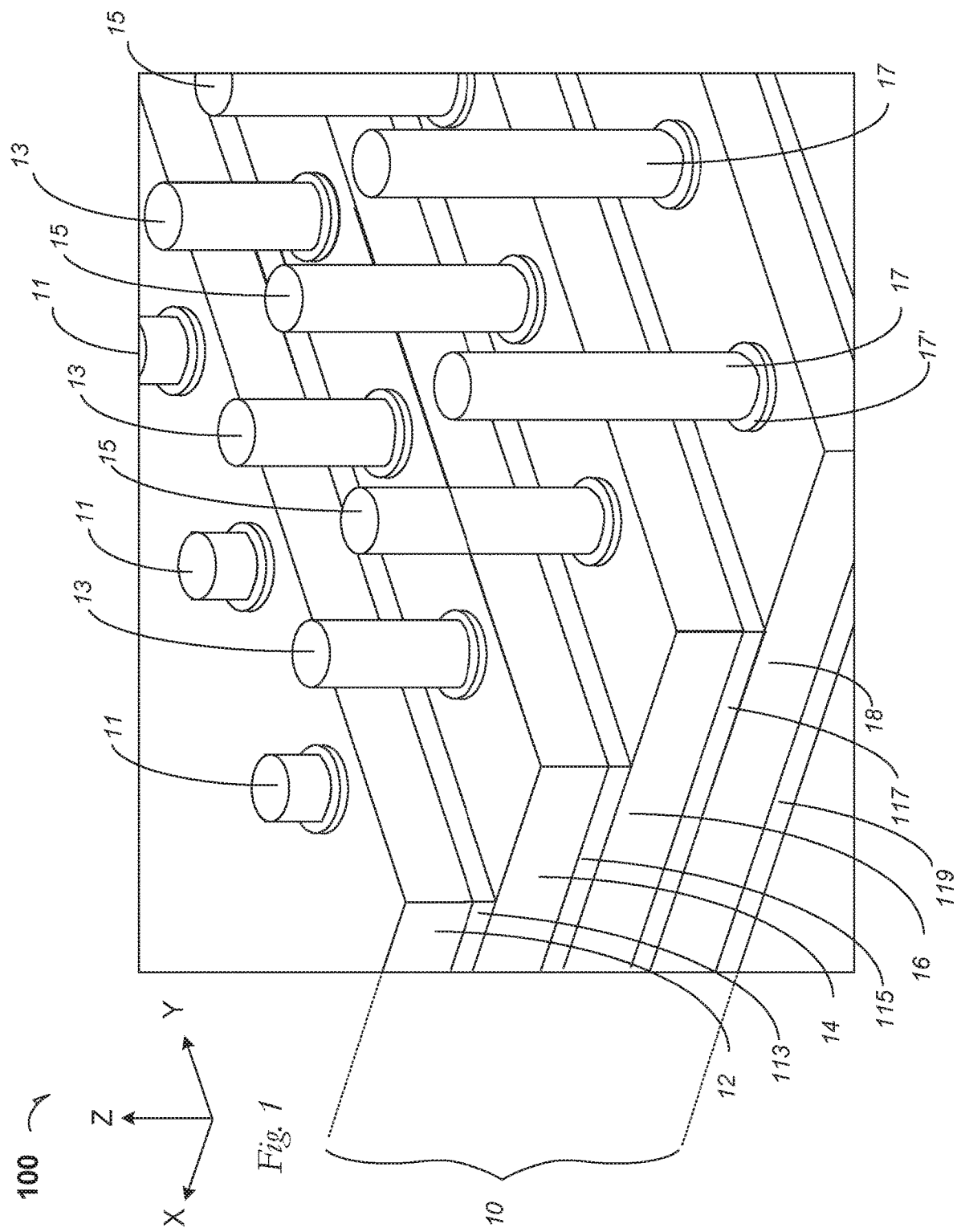

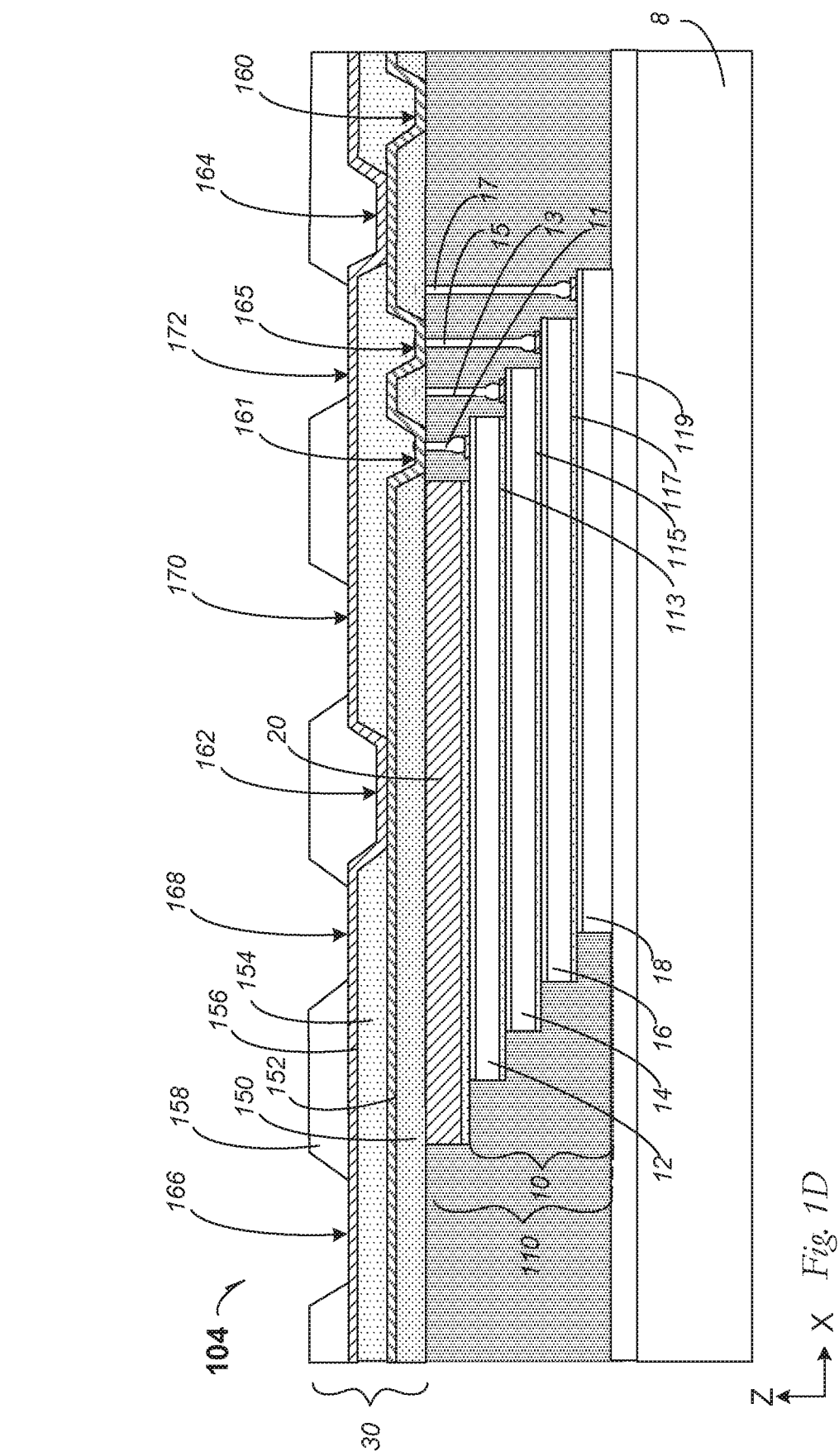

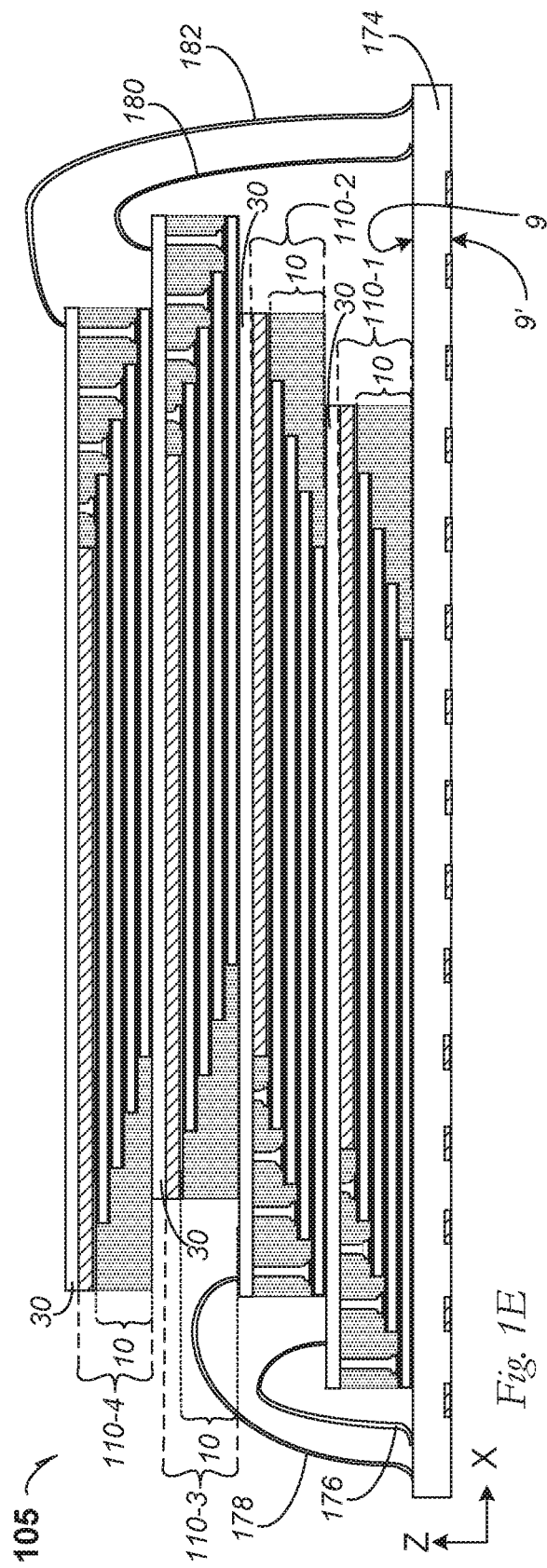

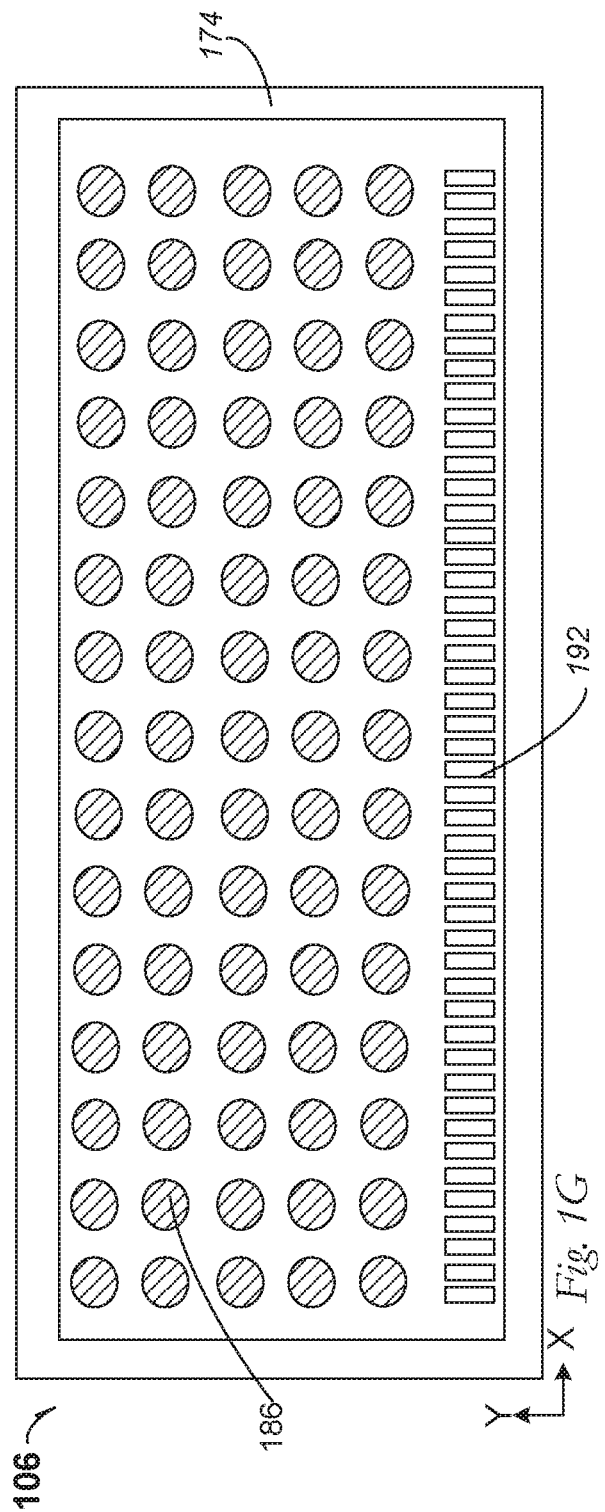

MULTI-DIE, VERTICAL-WIRE PACKAGE-IN-PACKAGE APPARATUS, AND METHODS OF MAKING SAME

PRIORITY APPLICATION

This application is a U.S. National Stage Application under 35 U.S.C. 371 from International Application No. PCT/US2017/068780, filed 28 Dec. 2017, published as WO 2019/132933, which is incorporated herein by reference in its entirety.

FIELD

This disclosure relates to package-in-package memory-die stacks with vertical bond wires. The memory-die stacks are assembled to a multiple memory-module package. The multiple memory-module package is configured as a vertical wire package-in-package (VWPiP) apparatus.

BACKGROUND

Computing devices such as memory modules, mobile telephones, smart phones and tablet computers are restricted in available space because there are size limitations dictated by intended use. Size reduction presents challenges for packaging.

BRIEF DESCRIPTION OF THE DRAWINGS

Various disclosed embodiments of are illustrated by way of example, and not by way of limitation, in the figures of the accompanying drawings and in which:

FIG. 1 is a perspective elevation detail of a portion of a memory-die stack with vertical bond wires that are also orthogonal bond wires according to an embodiment;

FIG. 1D is a cross-section elevation of the memory module depicted in FIG. 1C after further assembly according to an embodiment;

FIG. 1E is a cross-section elevation of a quad-pack of four memory dice each that forms a vertical-wire package-in-package (VWPiP) apparatus according to an embodiment:

FIG. 1G is a bottom plan of the vertical-wire package-in-package apparatus depicted in FIG. 1F according to an embodiment;

DETAILED DESCRIPTION

Figure 1A:
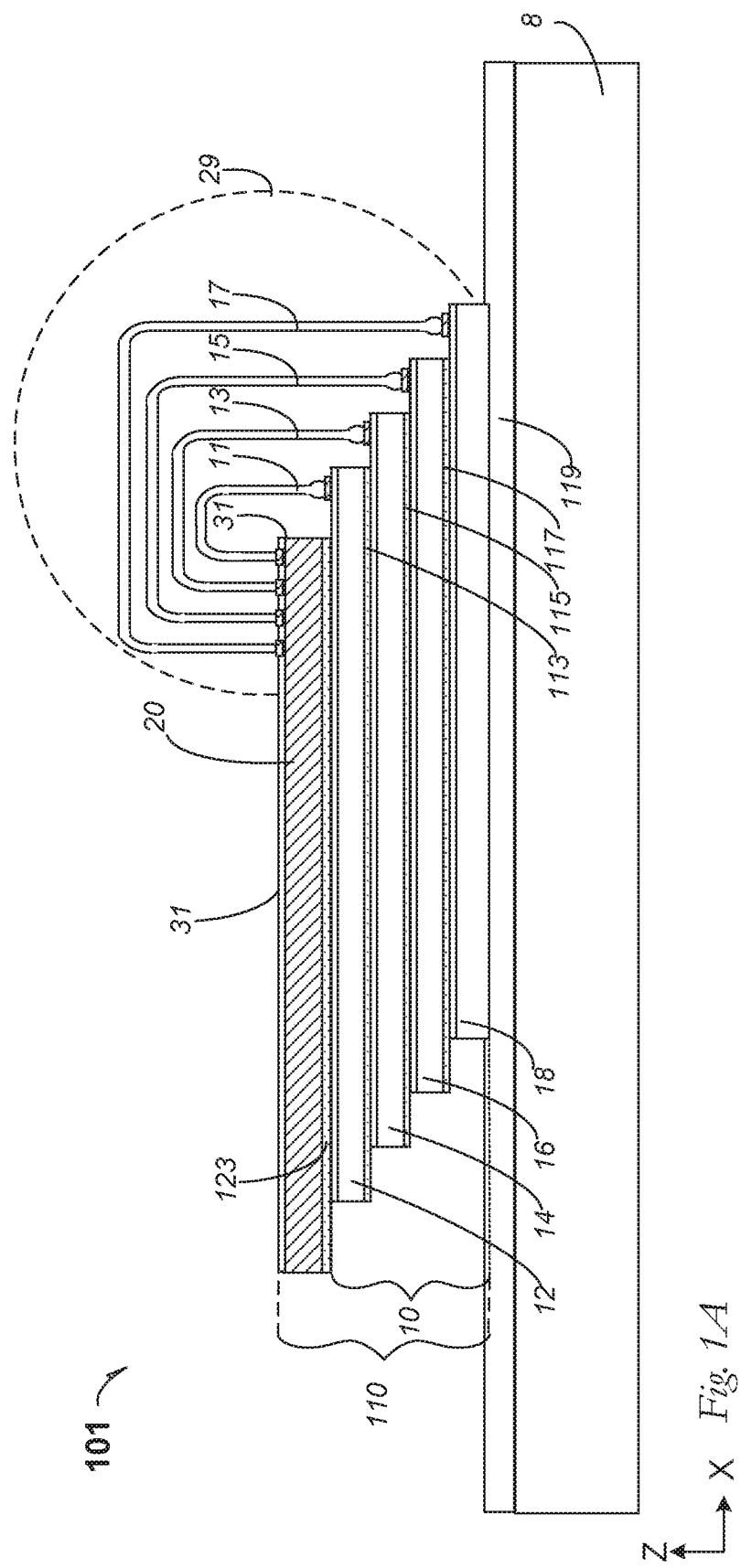
FIG. 1A is a cross-section elevation of a memory module that includes a memory-die stack with orthogonal bond wires according to a processing embodiment.

A vertical wire package-in-package (VWPiP) apparatus provides a high-capacity storage application with a useful process yield. Stacked memory modules for data center applications, such as 3D NAND logic VWPiP apparatus are disclosed. Double-digit memory die VWPiPs include four-die memory modules (memory-die stacks) in quad packages that includes 16 and 32 memory dice VWPiPs. Each four-die memory module is tested and bin-split before assembling into a quad package.

Each memory module is assembled with a redistribution layer (RDL) by pinning out the memory-die stack with vertical bond wires that breach a matrix at a landing surface. In an embodiment, the memory-die stack includes NAND flash memory. In an embodiment, the memory-die stack includes DRAM memory. In an embodiment, the memory-die stack includes SRAM memory. In an embodiment, the memory-die stack includes cross-point memory developed by Intel Corporation of Santa Clara, Calif. In an embodiment, the memory module is a solid-state drive. In an embodiment, the memory module is used for mass storage. In an embodiment, the VWPiP apparatus is used as a system in package apparatus.

FIG. 1 is a perspective elevation detail 100 of a portion of a memory-die stack 10 with vertical bond wires that are also orthogonal bond wires 11, 13, 15 and 17 according to an embodiment. Each orthogonal bond wire when it is bonded originating at a bond pad (not pictured), forms a bond-wire bead. A bond-wire bead 17' is illustrated for one of the wire bonds 17.

The memory-die stack 10 is part of a memory module 110 (see, e.g., FIG. 1A) according to an embodiment. In an embodiment, the memory module 110 includes the memory-die stack 10 with four non-volatile memory dice including first, second, third, and subsequent (in this instance, fourth) memory dice 12, 14, 16 and 18, respectively. The several memory dice are stacked in the Z-direction and are constructed along an X-direction in a stair-step configuration. In an embodiment, the memory module 110 is assembled upon an inorganic carrier 8 (see FIG. 1A) such as a glass carrier 8 and a carrier adhesion film 119.

In an embodiment, the memory module 110 is assembled using an adhesion first film 113 an adhesion second film 115, an adhesion third film 117, and the carrier adhesion film 119. In an embodiment, the carrier adhesion film 119 is used to stabilize the memory-die stack 10 during stack assembly. Other functionalities for memory module embodiments are disclosed.

A series of orthogonal first memory-die bond wires 11 are configured serially along the Y-direction on the first memory die 12 and they extend from the first memory die 12 in the Z-direction. The several memory-die bond wires 11 in the series, may be referred to as a first plurality of memory-die wires, where the numerical plurality refers to a cardinal-number plurality for a given useful number of vertical bond wires, and not the ordinal "first" related to the first die 12. In an embodiment, the first plurality is in a range from two to 32. Similarly, a series of orthogonal second memory-die bond wires 13 are configured on the second memory die 14. Likewise, a series of orthogonal third memory-die bond wires 15 are configured on the third memory die 16. And similarly, a series of orthogonal subsequent memory-die bond wires 17 are configured on the subsequent memory die 18. Construction of the series of orthogonal memory die bond wires is illustrated and described in this disclosure. In an embodiment, each memory die is identical and the respective pluralities of bond wires is numerically equal. In an embodiment, each memory die is not identical and the respective pluralities of bond wires is not necessarily numerically equal.

FIG. 1A is a cross-section elevation 101 of a memory module 110 that includes a memory-die stack 10 with orthogonal bond wires 11, 13, 15 and 17 according to a processing embodiment. During processing, the memory module 110 is being configured as a component for a vertical wire package-in-package (VWPiP) apparatus.

In an embodiment, a spacer 20 is also assembled with the first memory die 12 such as by adhering at an adhesive spacer-die film 123. In an embodiment, the spacer 20 is electronics-grade aluminum. In an embodiment, the spacer 20 is electronics-grade copper. In an embodiment, the spacer 20 is an electronics-grade metal or metal alloy.

Similar to the memory-die stack 10 depicted in FIG. 1, the memory-die stack 10 includes a subsequent memory die 18, as well as a subsequent adhesive layer 119 that is the carrier adhesion film 119 and that is used to stabilize the memory-die stack 10 during stack assembly.

In an embodiment, the spacer 20 provides an X-Y footprint that houses at least in part an active device that is adjacent the spacer 20. In an embodiment, the active device is a logic processor adjacent the spacer 20. In an embodiment, the active device is a memory controller hub 20 (MCH) adjacent the spacer 20. See FIG. 2.

It can be seen that respective vertical first, second, third, and subsequent memory-die bond wires 11, 13, 15 and 17 are anchored at their respective memory dice 12, 14, 16 and 18, but they are also vertically wire-loop anchored to the spacer 20. The spacer 20 is used to stabilize and to position the loop-anchored vertical bond wires 11, 13, 15 and 17 during the assembly of the memory-die stack 10. In an embodiment, the spacer 20 is a metallic material or some other material that is sufficiently rigid during assembly to provide strengthened loop-anchored wires 11, 13, 15 and 17. In an embodiment, the bond wires are looped onto the spacer 20 and attached at an adhesive 31 such as a dielectric material. The adhesive 31 may be configured to release by thermal-release processing, or it may be dissolved after backgrinding of a molding matrix precursor as will be further illustrated. In an embodiment, the adhesive 31 is patterned to allow the looped wires 11, 13, 15 and 17 to bond directly to the metal of the spacer 20.

In an embodiment, a process is carried out to coat the looped wires 11, 13, 15 and 17 as illustrated such as by spraying a dielectric coating as illustrated by a spray area 29 over the looped wires 11, 13, 15 and 17.

Figure 1B:
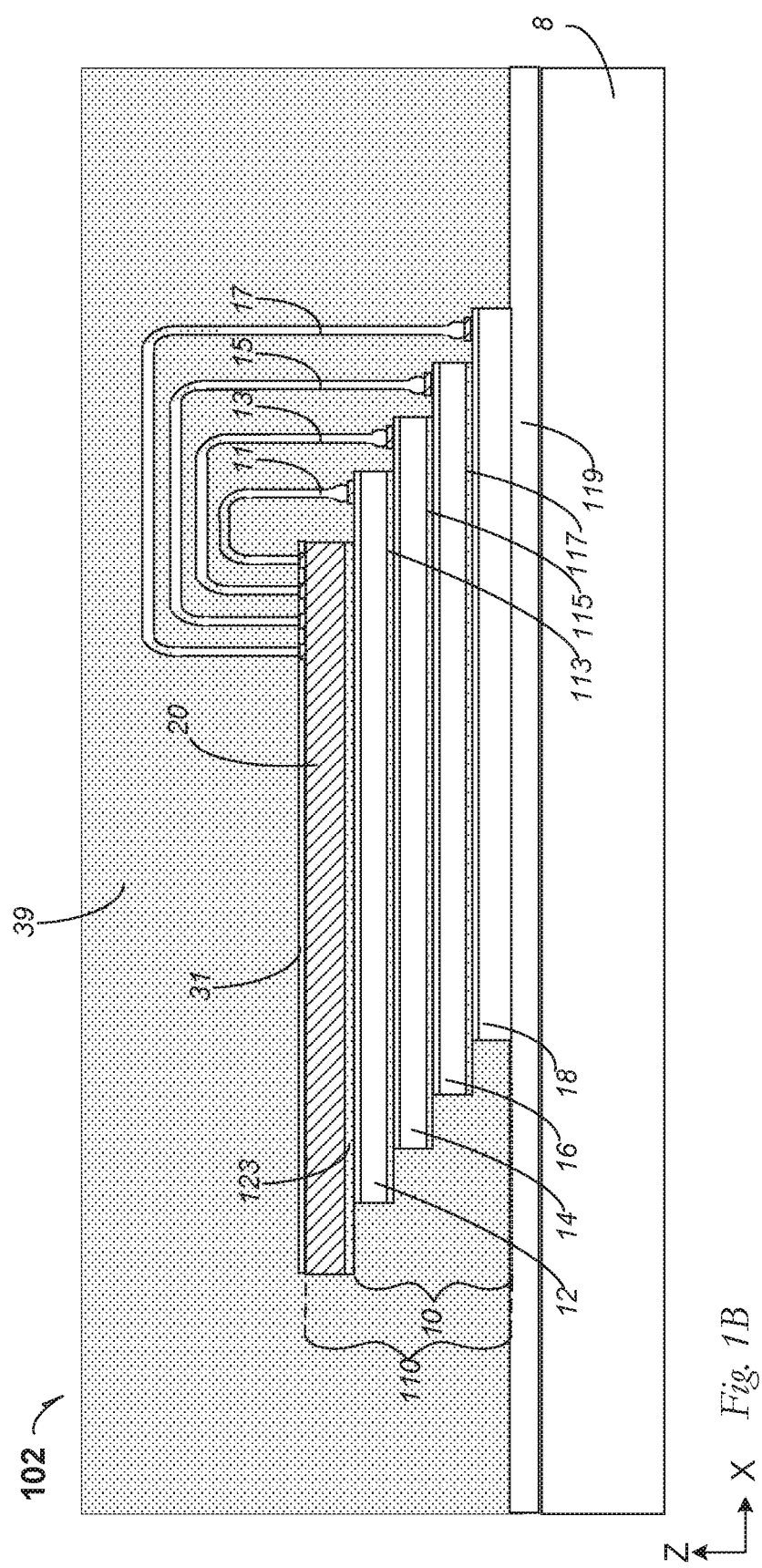
FIG. 1B is a cross-section elevation of the memory module depicted in FIG. 1A after further processing according to an embodiment.

FIG. 1B is a cross-section elevation 102 of the memory module 110 depicted in FIG. 1A after further processing according to an embodiment. A matrix precursor 39 has been formed over the memory module 110, including the memory-die stack 10 and the over the spacer 20. The loop-anchored vertical bond wires 11, 13, 15 and 17 are also affixed in the matrix precursor 39, but movement of the vertical portions is resisted by their loop-anchored configuration at each bond wire origination on each respective die, as well as at the spacer 20. The loop-anchored bond wires may be variously bent for attachment to the memory dice in the memory-die stack 10 and to the spacer 20 to facilitate few shorts, or no shorting between bond wires during assembly. As illustrated, the bond wires 11, 13, 15 and 17 extend vertically and orthogonally from their respective dice according to an embodiment.

In an embodiment, the matrix precursor 39 is assembled to the various structures. In an embodiment, selected spray depositing (item 29 see FIG. 1A) of matrix precursor 39 or a variant thereof, is first done to insulate the several loop-anchored bond wires, as well as to fill into spaces that may be too tight for useful bulk overmolding conditions (such as spaces between the bond wires), followed by injection molding of matrix precursor material 39.

Figure 1C:
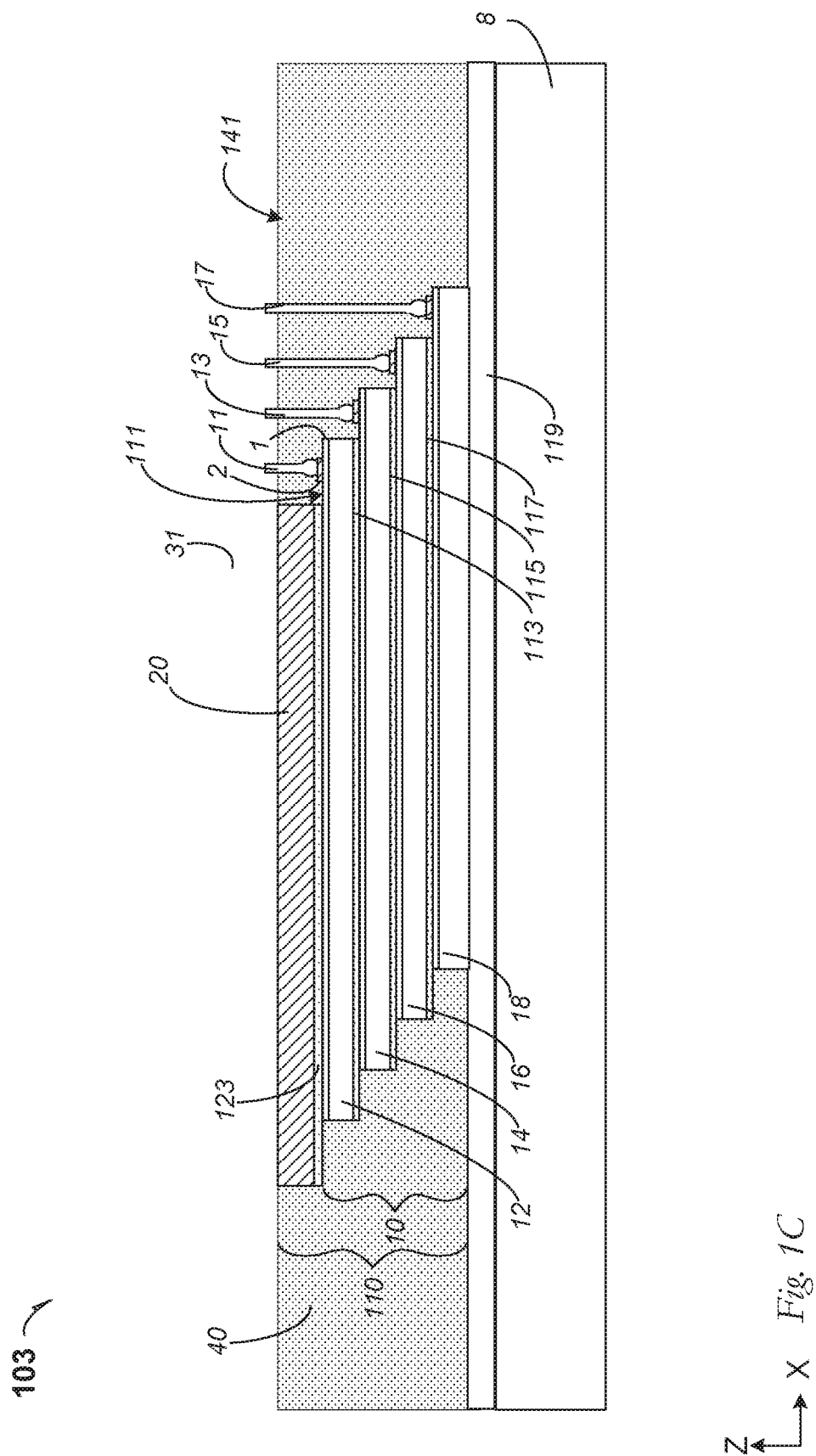
FIG. 1C is a cross-section elevation of memory module that is part of a vertical-wire package-in-package apparatus that uses vertical bond wire technology embodiments.

FIG. 1C is a cross-section elevation 103 of memory module 110 that is part of a vertical-wire package-in-package; in this instance, vertical-wire memory package-in-package (VWMPiP) apparatus that uses vertical bond wire technology embodiments. Further processing may be understood by reference to both FIGS. 1C and 1D.

After achieving a structure with the matrix precursor 39 (see FIG. 1B) after being cured into a matrix 40, the structures represented in FIGS. 1C and 1D are achieved by grinding or otherwise height-reducing the matrix precursor 39 and eventually approaching exposure of vertical portions of the bond wires 11, 13, 15 and 17.

Also by grinding to this extent, the formerly loop-anchored bond wires 11, 13, 15 and 17 depicted in FIG. 1B are reduced in size to approach the vertical bond wires 11, 13, 15 and 17 depicted in FIGS. 1C and 1D. Because of useful rigidity of the matrix 40 and as the loop-anchored bond wires are reduced to vertical bond wires, the matrix 40 holds the bond wires in place and resists the terminal end portions from deflecting.

In an embodiment as grinding of the matrix precursor 39 (FIG. 1B) approaches a useful endpoint, removing more matrix 40 is done by chemical etching. In an embodiment, the chemical etching is done by chemical-mechanical polishing (CMP) where etch solvents are selective to leaving metallic materials such as the terminal ends of the vertical bond wires 11, 13, 15 and 17 such that the terminal ends of the vertical bond wires 11, 13, 15 and 17 protrude from the matrix 40 as illustrated in FIGS. 1C and 1D. In an embodiment, etching is done following grinding. In an embodiment, etching is done alone without mechanical polishing.

The first memory die 12 includes an active surface 111 and a backside surface (not indicated) that is covered with an adhesive first film 113. In an embodiment, the active surface 111 includes both semiconductive structures and metallization.

The first memory die 12 is fixed in the matrix 40 such as a molding material, and a first die vertical bond wire 11 contacts the active surface 111 and protrudes through the matrix 40 at a landing surface 141 for the memory module 110. The landing surface 141 is thus designated as the memory module 110 will be assembled onto a redistribution layer (RDL) structure at that landing surface 141. In an embodiment, the first die vertical bond wire 11 extends orthogonally from the active surface 111 of the first memory die 12. By "orthogonal" it is meant the bond wire 11 visually appears to be extending uniformly and directly at a right angle away from the active surface 111 of the first memory die 12 to the terminal end of the bond wire 11. In an embodiment, "orthogonal" is quantified by observing the terminal end of the bond wire 11 protrudes above the landing surface 141 of the matrix 40, and the protruding end of the bond wire 11 has not deflected within the matrix 40 to either side in the X-direction more than the stair edge 1 of the first memory die 12 or more than the equivalent distance from the bond wire 11 away from the stair edge 1. This definition also applies to equivalent distance limitations in the Y-direction. In an embodiment, "orthogonal" is quantified by observing the terminal end of the vertical bond wire 11 has not deflected within the matrix 40 to either side in the X-direction of the bond pad edge 2 to which the vertical bond wire 11 is bonded. This definition also applies to equivalent distance limitations in the Y-direction.

The matrix 40 may also be referred to as a package material 40 according to an embodiment. The matrix 40 may also be referred to as an encapsulation molding compound (EMC) 40 according to an embodiment. Various organic package materials may be used for the matrix 40. Various EMC materials may be used for the matrix 40.

In an embodiment, the memory module 110 includes the first memory die 12 (which is part of a stair-stacked memory-die stack 10) stacked against the spacer 20 at the active surface 111 by the spacer adhesive 123. The memory-die stack 10 and the spacer 20 are seated in the matrix 40, but processing may result in a molding compound being flowed over and around the memory-die stack 10 such that it may also be termed affixed in the matrix 40.

In an embodiment, the memory module 110 includes four stacked memory dice including the first memory die 12, the second memory die 14, the third memory die 16, and the subsequent, this embodiment, fourth memory die 18. Where the second memory die 14 is the last die in the memory-die stack 10, it may also be referred to as a subsequent memory die 14. Similarly, where the third memory die 16 is the last die in the memory-die stack 10, it may also be referred to as a subsequent memory die 16. By the same token, where the fourth memory die 18 is the last die in the memory-die stack 10, it may also be referred to as a subsequent memory die 18. It is now understood that more than four memory dice may be stair-stacked such as eight memory dice with first- through-seventh memory dice and a subsequent memory die according to an embodiment. Hereinafter, description of memory-die stack 10 depicted in FIG. 1A will refer to the memory first- second- third- and subsequent dice 12, 14, 16 and 18, respectively. It may now be understood that more than four stair-stacked memory dice may be used.

In an embodiment, the spacer 20 is also at least partially encapsulated in the matrix 40.

In an embodiment, testing of an assembled memory module 110 as depicted in FIG. 1C where vertical bond wires 11, 13, 15 and 17 are exposed. Since a useful number of vertical bond wires 11, 13, 15 and 17 are exposed, testing can be carried out on the memory module 110 before further assembly. Testing methods may include placing an individual probe onto a selected bond wire, or a testing card may be mated at the landing surface 141 that connects to all the vertical bond wires 11, 13, 15 and 17.

After testing is completed and a useful yield has been confirmed, an RDL 30 (see FIG. 1D) may be fabricated to couple the memory-die stack 10 for further assembly.

FIG. 1D is a cross-section elevation 104 of the memory module 110 depicted in FIG. 1C after further assembly according to an embodiment. The structure 103, taken from FIG. 1C, has been processed with a redistribution layer (RDL) 30 that couples both to the several dice in the memory-die stack 12, 14, 16 and 18 as well makes adhesive contact to the spacer 20.

In an embodiment, a first RDL dielectric 150 is formed and patterned to allow a first trace layer 152 to contact the orthogonal and vertical first and second memory-die bond wires 11 and 13, respectively. In an embodiment, a second RDL dielectric 154 covers the first trace layer 152, and it is patterned to allow a second trace layer 156 to selectively contact the first trace layer 152. More layers, including dielectric and trace layers may be added to the RDL 30 where a specific application is useful. In an embodiment, a solder-resist layer 158 is patterned above the second trace layer 156, and solder-resist opens 166, 168, 170 and 172 expose the second trace layer 156 in order to accept electrical bumps such as solder-paste bumps. In an embodiment, one of the solder-resist opens such as solder-resist open 166 is configured to accept a wire bond as this solder-resist open is near the edge of the RDL 30.

After completion of the RDL 30, the carrier 8 is removed.

FIG. 1E is a cross-section elevation of a quad-pack of four memory dice each that forms a vertical-wire package-in-package (VWPiP) apparatus 105 according to an embodiment. As illustrated, each memory die stack 10 is part of a four-die memory module 110, and each memory module 110 is coupled to an RDL 30 (see FIG. 1D). After completion of the RDL 30, the carrier 8 and the carrier adhesion film 119, depicted also in FIG. 1D, are removed, and each memory module 110 with the accompanying RDL 30 are assembled into the quad-pack VWPiP apparatus 105.

In an embodiment, the VWPiP apparatus 105 is assembled onto a bond-wire board 174, that may be referred to as a VWPiP board 174. The bond-wire board 174 includes a module side 9 that is opposite a land side 9'.

Each memory module 110 is stair-stacked onto the VWPiP board 174, with the two bottom memory modules 110-1 and 110-2, respectively wire-bonded with curved wire bonds 176 and 178 to the VWPiP board 174 from the left side, and the two top memory modules 110-3 and 110-4, respectively wire-bonded with curved wire bonds 180 and 182 from the right side. As illustrated, the memory modules 110-1 and 110-2 may be referred to as first and second memory modules, respectively, and the second memory module 110-2 is stacked on the first memory module 110-1, and the curved wire bonds 176 and 178 are attached to the bond-wire board 174 at a first edge. By contrast, the memory modules 110-3 and 110-4 may be referred to as third and subsequent (in this instance, fourth) memory modules, respectively, and the third memory module 110-3 is stacked below the subsequent memory module 110-2, and the curved wire bonds 180 and 182 are attached to the bond-wire board 174 at an edge other than the first edge. This may be referred to as a vertical bond wire in the first module 110-1 is arranged opposite a vertical bond wire in the subsequent module 110-4.

Figure 1F:
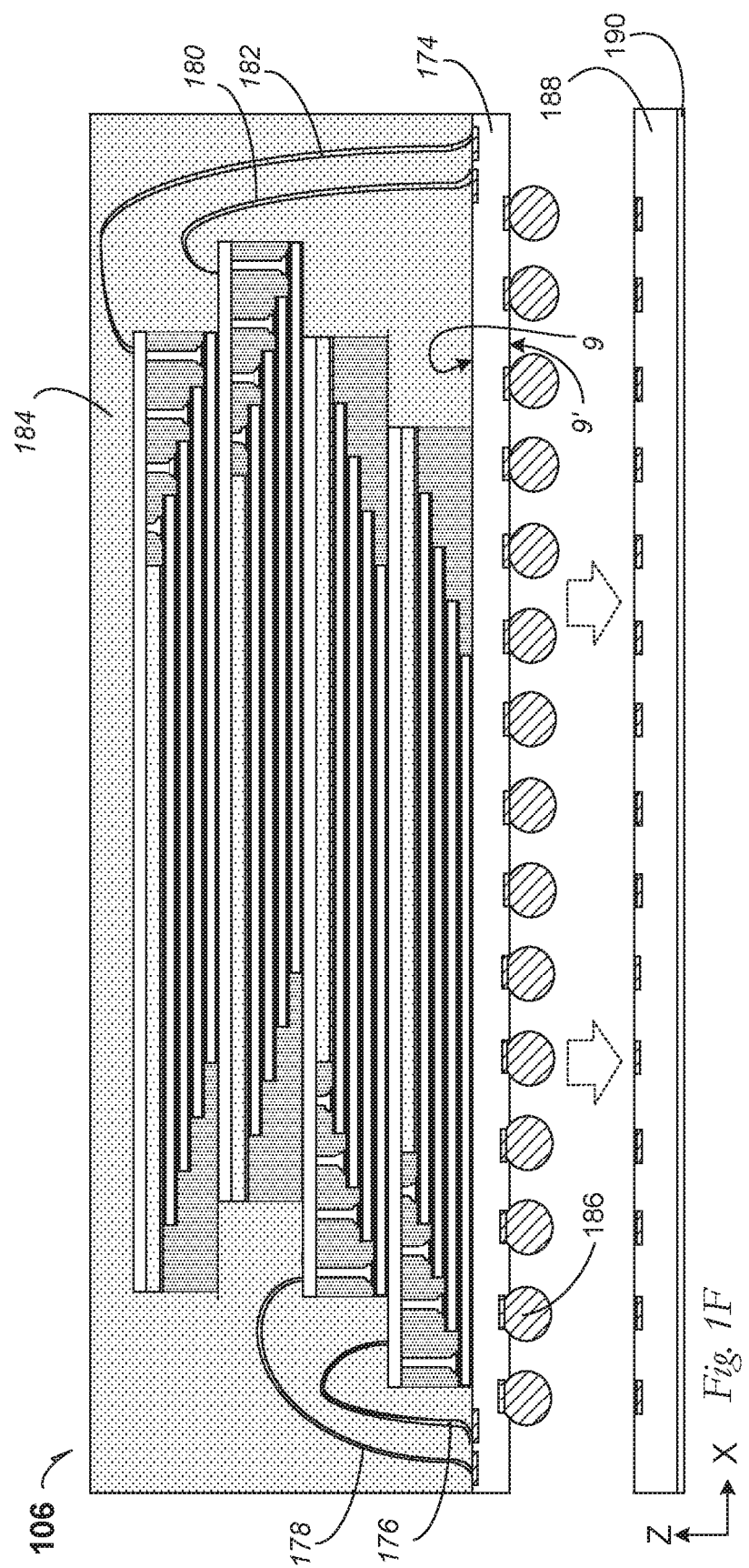
FIG. 1F is a cross-section elevation of the memory package-in-package apparatus depicted in FIG. 1E after further processing according to an embodiment.

FIG. 1F is a cross-section elevation of the memory package-in-package apparatus 105 depicted in FIG. 1E after further processing according to an embodiment. The memory-die centric VWPiP 106 has been overmolded with a package-in-package encapsulation (PiPE) 184 that structurally solidifies the several memory modules to the VWPiP board 174, as well as that protects the several curved wire bonds 176, 178, 180 and 182.

In an embodiment, testing of the assembled VWPiP apparatus 106 where bumps 186 pin out the several wire bonds 176, 178, 180 and 182. Testing can be carried out on the VWPiP apparatus 106 before further assembly to a computing system. Testing methods may include placing an individual probe onto a selected bump in the bump array 186, as well as placing individual probes onto test fingers (see FIG. 1G).

After testing is completed and a useful yield has been confirmed, the VWPiP apparatus 106 may be assembled to a computing system.

As illustrated, a 16 memory-die VWPiP 106 has been achieved by assembling four post-test memory modules 110-1, 110-2, 110-3 and 110-4 onto a bond-wire board 174, followed by overmolding 184 on the module side 9. In an embodiment, the VWPiP 106 is part of a chipset 420 (see FIG. 4) FIG. 1G is a bottom plan of the VWPiP apparatus 106 depicted in FIG. 1F according to an embodiment. The bond-wire board 174 and the bump array 186 are complemented with a bond-finger array 192. In an embodiment, testing of the entire VWPiP apparatus 106 is carried out by using the bond-finger array 192. In an embodiment, testing of the entire VWPiP apparatus 106 is carried out by using the bump array 186.

Figure 2:
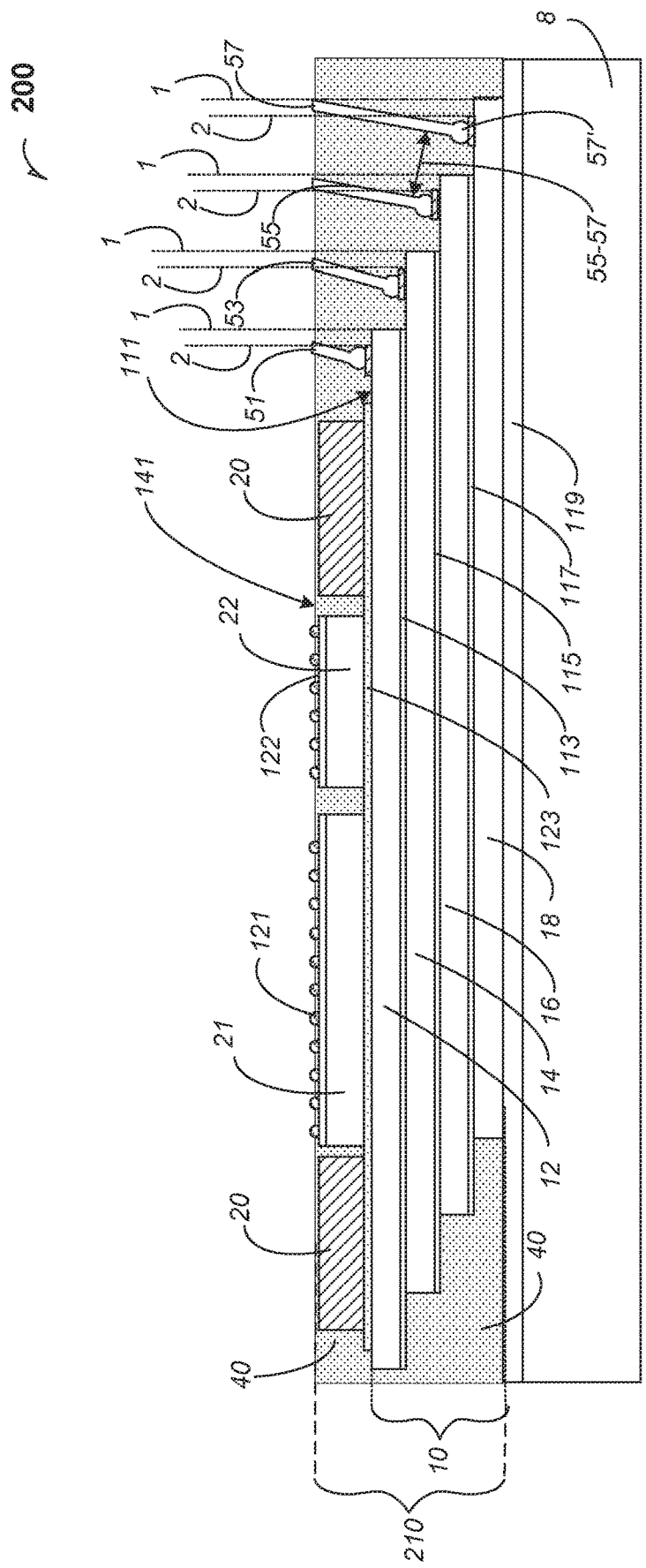
FIG. 2 is a cross-section elevation of a memory module that includes a memory-die stack according to several embodiments.

FIG. 2 is a cross-section elevation of a memory module 210 that includes a memory-die stack 10 according to several embodiments. In an embodiment, the spacer 20 is a frame-shaped structure that allows for looped-attachment of several vertical bond wires 51, 53, 55 and 57 similarly as illustrated for the apparatus 101 depicted in FIG. 1A, except the bond wires are not orthogonal. Further, the frame shape allows for an infield above the first memory die 12, to seat at least one semiconductive device 21, such as a processor 21 made by Intel Corporation of Santa Clara, Calif. In an embodiment, a semiconductive device 22 such as a memory controller hub (MCH) that can control all the memory devices in the VWPiP apparatus embodiments. In an embodiment, only a processor 21 is present. In an embodiment, only an MCH 22 is present. In an embodiment, only one processor is used in an entire VWPiP. In an embodiment, only one MCH is used in an entire VWPiP. Where present, the spacer 20, and if present at least one of the processor die 21 and the MCH 22, is seated on an adhesive processor-die film 123. In an embodiment, the processor 21 includes an active surface that has both semiconductive structures as well as metallization that leads to a processor bump array 121. In an embodiment, the MCH 22 if present includes an active surface that has both semiconductive structures as well as metallization that leads to a MCH bump array 122. The processor 21 is also seated in the matrix 40, but processing may result in a molding compound being flowed over and around the processor first die 20 such that it may also be termed affixed in the matrix 40. In an embodiment, the processor 21 is an ASIC such as for a platform controller hub. In an embodiment, the processor 21 includes ASIC such as for a platform controller hub, but it also includes additional microelectronic device capability for core processing such as cache functionality including level-zero (L0) and L1 caches.

During the height-reducing to achieve the matrix 40, electrical bumps 121 and 122 are exposed with the same care to leave them intact as the tips of the bond wires 51, 53, 55 and 57. It may now be understood, at least one processor 21 or one MCH 22 may be assembled with vertical and orthogonal bond wires similar to those depicted in FIGS. 1 through 1F.

Compared to FIGS. 1A to 1F embodiments, FIG. 2 embodiments includes forming the bond wires vertically but not orthogonally. In an embodiment, pinning out the vertical bond wires may be useful at a location other than directly orthogonally from the originating bond pads from the plurality dice in the memory-die stack.

The first memory die 12 includes an active surface 111 and a backside surface (not indicated) that is covered with an adhesive first film 113. The active surface 111 includes both semiconductive structures and metallization. The first memory die 12 is fixed in the matrix 40 such as a molding material, and a first die vertical (but not orthogonal) bond wire 51 contacts the active surface 111 and protrudes through the matrix 40 at a landing surface 141 for the memory module 210. The landing surface 141 is thus designated, as the memory module 210 will be assembled onto an RDL structure at that surface, such as the RDL 30 depicted in FIG. 1D, adjusted for the vertical but not orthogonal bond wires.

The first die vertical bond wire 51 extends vertically from the active surface 111 of the first memory die 12. By "vertical" it is meant the bond wire 51 visually appears to be linearly extending uniformly and directly away from the active surface 111 of the first memory die 12 to the terminal end of the bond wire 51, but not necessarily orthogonally.

In an embodiment. "vertically, but not necessarily orthogonally" is qualified by observing the terminal end of the bond wire 51 protrudes above the landing surface 141 of the matrix 40, and the protruding end of the bond wire 51, has deflected within the matrix 40 to either side in the X-direction. The degree of deflection can be quantified where the protruding end is deflected more than at least one of the stair edge 1 or the bond pad edge 2 of the first memory die 12. It can be seen this definition is dependent upon the relative lengths of any of the bond wires 51, 53, 55 and 57, and whereas the bond wire 51 may only deflect more than the bond pad edge 2 as it breaches the landing surface 141, the remaining bond wires may deflect and intersect both edges 1 and 2.

Collectively in an embodiment, a plurality of vertical bond wires is substantially co-parallel as each originates from its respective bond pads and terminates where it breaches the landing surface 141. In an embodiment, "co-parallel" is quantified by constraining each vertical bond wire in a projected corridor along the trajectory of the bond wire 57, spaced apart from a right-angle distance 55-57 that can be measured between two adjacent bond wires, e.g., 55 and 57, and the distance 55-57 is taken where a bond wire 57 emerges from the bond-wire bead 57'. The distance 55-57 does not vary more than twice the X-dimension width of a bond-wire bead 57' to where the bond wire breaches the landing surface 141. Consequently, each vertical bond wire when compared to e.g., and adjacent bond wire, remains within the projected corridor measured by the distance 55-57, plus twice the bond-wire bead width 57'.

It can now be understood that permutations of orthogonal and non-orthogonal vertical bond wires may be in a single package. For example, orthogonal and vertical bond wires 11 and 13 as depicted in FIG. 1C, could be combined with vertical bond wires 55 and 57 as depicted in FIG. 2. Such a varied bond-wire scheme accommodates constrained pin-out requirements for a VWPiP apparatus such as quad-pack, four module apparatus. Such a varied bond-wire scheme accommodates diverse dice such as where first- and second dice 12 and 14 are similar to each other, but they differ from the third- and subsequent dice 16 and 18 and where third- and subsequent dice 16 and 18 are similar to each other in an embodiment.

In an embodiment, at least one of a processor 21 or an MCH 22 is assembled to the first memory module 110-1, depicted in FIG. 1G, and the at least one processor 21 or MCH 22 drives at least one of logic and memory operations for the entire VWMPiP 105.

Figure 4:
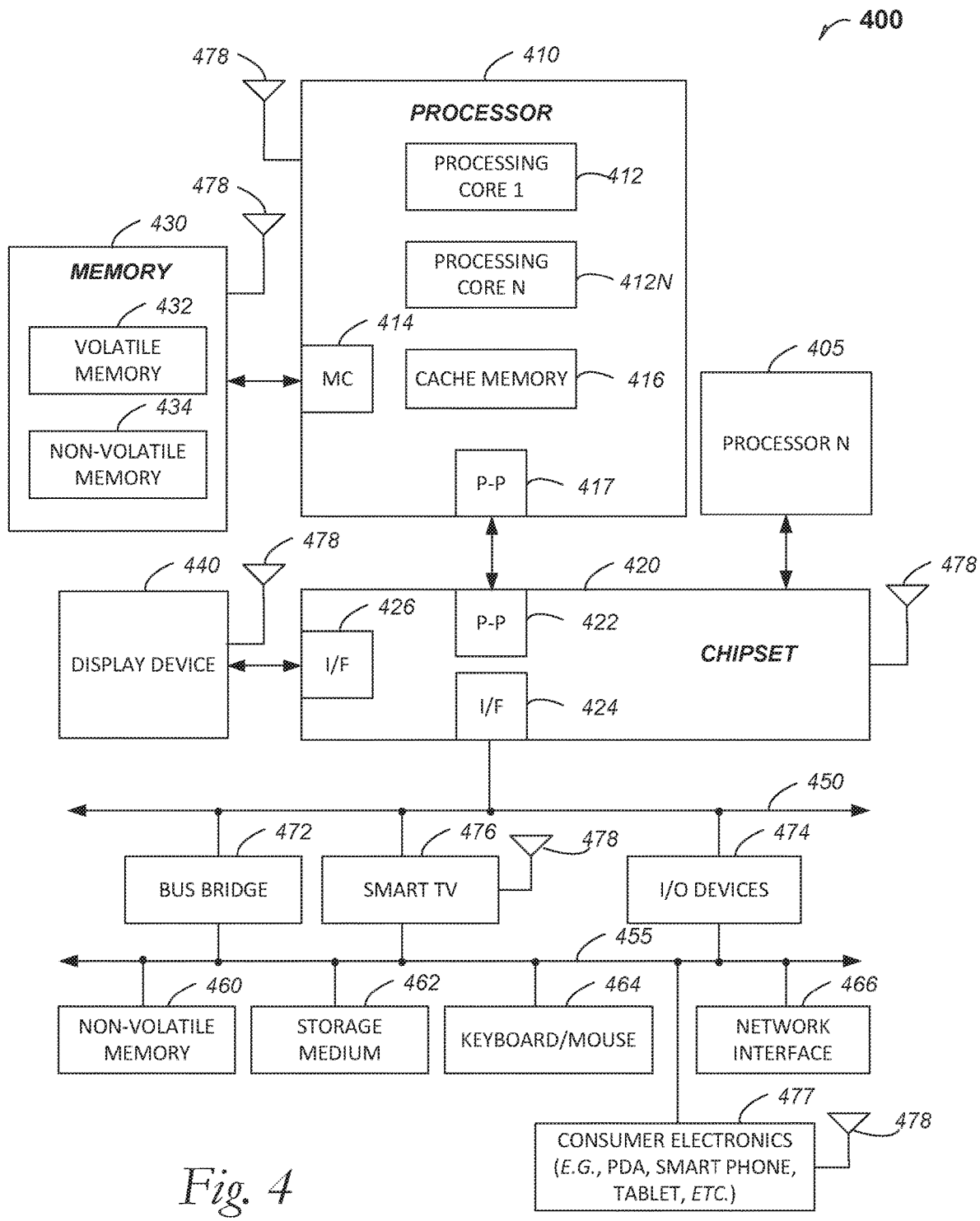
FIG. 4 is included to show an example of a higher level device application for the disclosed embodiments.

In an embodiment, the memory module 210 uses at least one of a processor 21 or an MCY 22 that is part of a chipset 420 (see FIG. 4)

Figure 3:
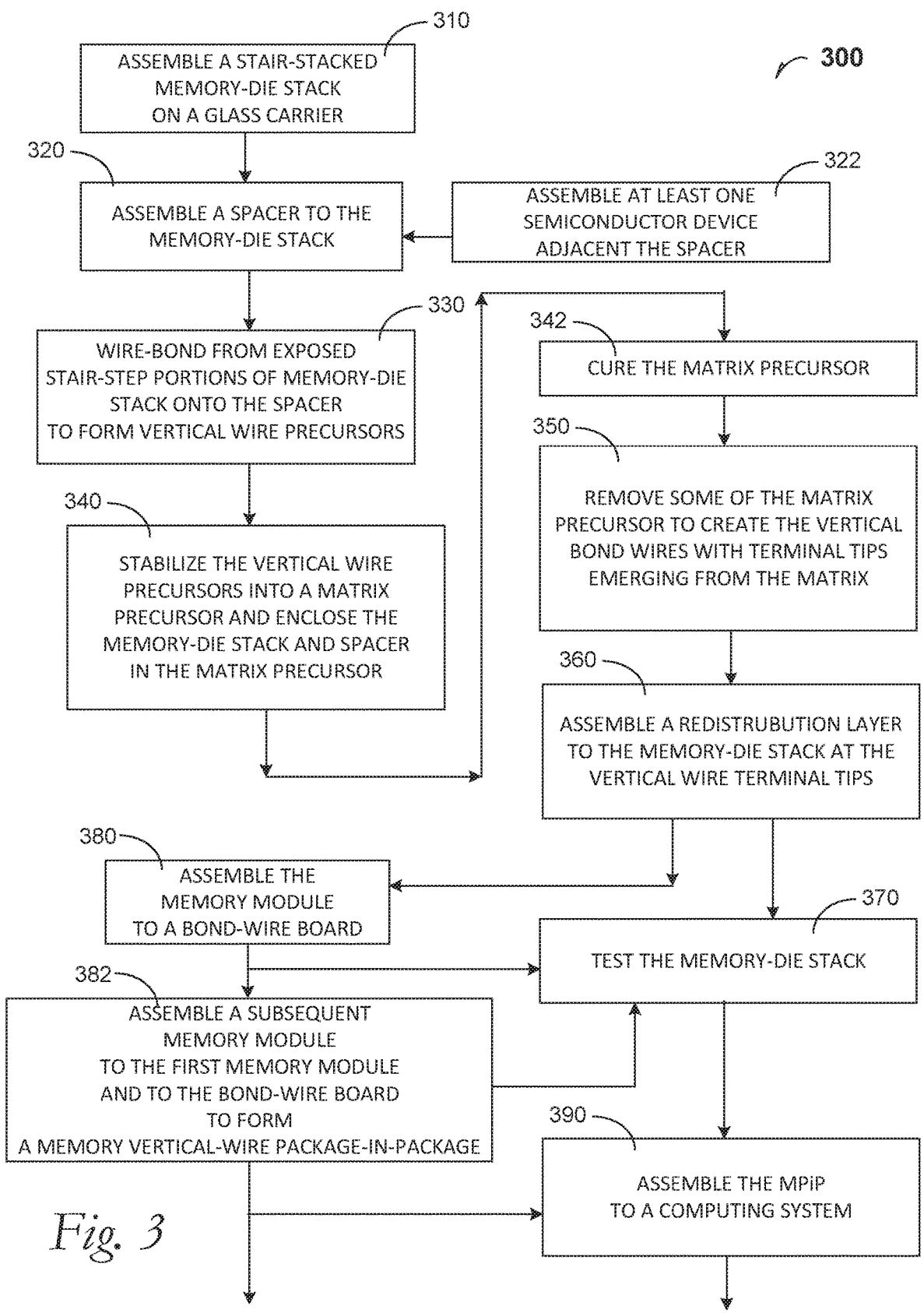
FIG. 3 is a process flow diagram that illustrates processing embodiments.

FIG. 3 is a process flow diagram 300 that illustrates processing embodiments.

At 310, the process includes assembling a memory-die stack on a glass carrier.

At 320, the process includes assembling a spacer to the memory-die stack.

At 322, the process includes assembling at least one semiconductor device adjacent the spacer.

At 330, the process includes wire-bonding from exposed stair-step portions of the memory-die stack to the spacer to form vertical bond wire precursors.

At 340, the process includes stabilizing the vertical bond wire precursors into a matrix precursor and to enclose the memory-die stack and spacer in the matrix precursor.

At 342, the process includes curing the matrix precursor.

At 350, the process includes removing some of the matrix precursor to expose create the vertical wire precursors with terminal tips emerging from the matrix.

At 360, the process includes assembling a redistribution layer to the memory-die stack at the vertical bond wire terminal tips.

At 370, the process includes testing the memory-die stack. Successful testing results in "known good module" where a given memory-die stack with the corresponding RDL has passed testing.

At 380, the process includes assembling the memory module to a bond-wire board by a curved wire bond. As depicted, the board can be the bond-wire board 174.

At 382, the process includes assembling a subsequent memory module to the first memory module and to the bond-wire board by a subsequent curved wire bond, to form a vertical wire package-in-package (VWPiP) that is an assembly of memory modules.

At 390, the process includes assembling the VWPiP to a computing system.

FIG. 4 is included to show an example of a higher level device application for the disclosed embodiments. In an embodiment, a system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, the VWPiP apparatus embodiment 400 is a system on a chip (SOC) system.

In an embodiment, the processor 410 has one or more processing cores 412 and 412N, where 412N represents the Nth processor core inside processor 410 where N is a positive integer. In an embodiment, the electronic device system 400 using a VWPiP apparatus embodiment that includes multiple processors including 410 and 405, where the processor 405 has logic similar or identical to the logic of the processor 410. In an embodiment, the processing core 412 includes, but is not limited to, pre-fetch logic to fetch instructions, decode logic to decode the instructions, execution logic to execute instructions and the like. In an embodiment, the processor 410 has a cache memory 416 to cache at least one of instructions and data for the SiP device system 400. The cache memory 416 may be organized into a hierarchal structure including one or more levels of cache memory.

In an embodiment, the processor 410 includes a memory controller 414, which is operable to perform functions that enable the processor 410 to access and communicate with memory 430 that includes at least one of a volatile memory 432 and a non-volatile memory 434. In an embodiment, the processor 410 is coupled with memory 430 and chipset 420. The processor 410 may also be coupled to a wireless antenna 478 to communicate with any device configured to at least one of transmit and receive wireless signals. In an embodiment, the wireless antenna interface 478 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 432 includes, but is not limited to, Synchronous Dynamic Random Access Memory (SDRAM), Dynamic Random Access Memory (DRAM). RAMBUS Dynamic Random Access Memory (RDRAM), and/or any other type of random access memory device.

The non-volatile memory 434 includes, but is not limited to, flash memory, phase change memory (PCM), read-only memory (ROM), electrically erasable programmable read-only memory (EEPROM), or any other type of non-volatile memory device.

The memory 430 stores information and instructions to be executed by the processor 410. In an embodiment, the memory 430 may also store temporary variables or other intermediate information while the processor 410 is executing instructions. In the illustrated embodiment, the chipset 420 connects with processor 410 via Point-to-Point (PtP or P-P) interfaces 417 and 422. Either of these PtP embodiments may be achieved using a VWPiP apparatus embodiment as set forth in this disclosure. The chipset 420 enables the processor 410 to connect to other elements in the SiP device system 400. In an embodiment, interfaces 417 and 422 operate in accordance with a PtP communication protocol such as the Intel® QuickPath Interconnect (QPI) or the like. In other embodiments, a different interconnect may be used.

In an embodiment, the chipset 420 is operable to communicate with the processor 410, 405N, the display device 440, and other devices 472, 476, 474, 460, 462, 464, 466, 477, etc. The chipset 420 may also be coupled to a wireless antenna 478 to communicate with any device configured to at least do one of transmit and receive wireless signals.

The chipset 420 connects to the display device 440 via the interface 426. The display 440 may be, for example, a liquid crystal display (LCD), a plasma display, cathode ray tube (CRT) display, or any other form of visual display device. In an embodiment, the processor 410 and the chipset 420 are merged into a single SOC. Additionally, the chipset 420 connects to one or more buses 450 and 455 that interconnect various elements 474, 460, 462, 464, and 466. Buses 450 and 455 may be interconnected together via a bus bridge 472. In an embodiment, the chipset 420 couples with a non-volatile memory 460, a mass storage device(s) 462, a keyboard/mouse 464, and a network interface 466 by way of at least one of the interface 424 and 474, the smart TV 476, and the consumer electronics 477, etc.

In an embodiment, the mass storage device 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family. Home Plug AV (HPAV). Ultra Wide Band (UWB), Bluetooth. WiMax, or any form of wireless communication protocol.

While the modules shown in FIG. 4 are depicted as separate blocks within the VWPiP apparatus in a computing system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into the processor core 412. Where useful, the computing system 400 may have an outer shell that is part of the several land side board embodiments described in this disclosure. For example, the land side board 188 depicted in FIG. 1F, has an outer surface 190 that is sufficiently insulated that it may act as an outer shell of the computing system 400 depicted in FIG. 4. This embodiment may be seen in each of the cross-section elevations including an outer surface 190 for the VWPiP apparatus embodiment depicted in FIGS. 1E, 1F and 2.

Figure 5:
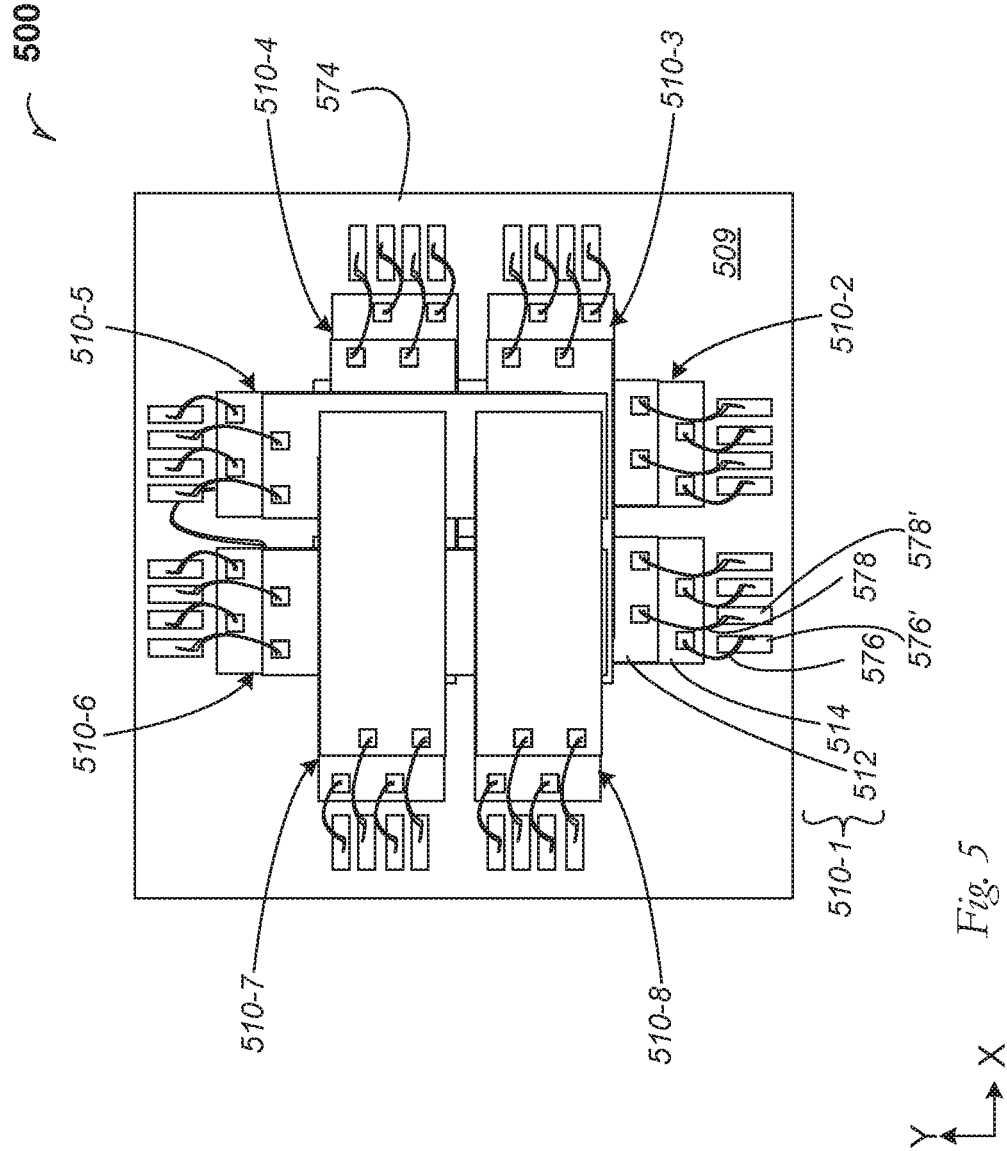
FIG. 5 is a top plan of a vertical-wire package-in-package apparatus according to an embodiment.

FIG. 5 is a top plan of a vertical-wire package-in-package apparatus 500 according to an embodiment. A first memory module 510-1 includes a first memory die 512 and a subsequent memory die 514, and each includes vertical bond wires as illustrated and described for the several embodiments depicted in FIGS. 1 through 1F and 2. The first memory module 510-1 is coupled to a bond-wire board with curved wire bonds 576 and 578 to respective bond-wire fingers 576' and 578' on a module side 509 of the bond-wire board 574.

A subsequent memory module 510-8 is stacked above the first memory module 510-1, and the subsequent memory module 510-8 is rotated orthogonal, within the X-Y planes to the first memory module 510-1.

As illustrated, a total of eight memory modules with two stair-stacked memory dice each, 510-1 through 510-8 are wire-bonded to the bond-wire board 574. Further, each memory module includes a corresponding RDL and curved wire bonds that couple between the memory module and bond-wire board 574.

The VWPiP apparatus apparatus is configured with two memory modules each that are side-by-side. Accordingly, the first memory module 510-1 and the second memory module 510-2 are side-by-side on the module side 509. The third memory module 510-3 and the fourth memory module 510-4 are stacked side-by-side on the first memory module 510-1 and the second memory module 510-2, and are arranged orthogonal to the first memory module 510-1 and the second memory module 510-2. The fifth memory module 510-5 and the sixth memory module 510-6 are stacked side-by-side on the third memory module 510-3 and the fourth memory module 510-4, and are arranged orthogonal to the third memory module 510-3 and the fourth memory module 510-4. And the seventh memory module 510-7 and the subsequent (in this instance, eighth) memory module 510-8 are stacked side-by-side on the fifth memory module 510-5 and the sixth memory module 510-6, and are arranged orthogonal to the fifth memory module 510-5 and the sixth memory module 510-6. Accordingly, as illustrated, 16 memory dice are depicted in the illustrated VWPiP 500.

It now may be understood that up to four stair-stacked dice each may be configured in a given memory module embodiment, such that at total of 32 memory dice are configured in the VWPiP 500.

To illustrate the VWPiP apparatus embodiments and methods disclosed herein, a non-limiting list of examples is provided herein:

Example 1 is a package-in-package apparatus comprising: a first memory module coupled to a bond-wire board through a first vertical bond wire, a first redistribution layer and a first curved wire bond, wherein the first vertical bond wire emerges from a first matrix; a subsequent memory module disposed above the first memory module and coupled to the bond-wire board through a subsequent vertical bond wire, a subsequent redistribution layer and a subsequent curved wire bond, wherein the subsequent vertical bond wire emerges from a subsequent matrix; and an encapsulation that covers the first and subsequent memory modules, the first and subsequent curved wire bonds, and a module side of the bond-wire board.

In Example 2, the subject matter of Example 1 optionally includes a second memory module stacked above and on the first memory module, and coupled to the bond-wire board through a second vertical bond wire, a second redistribution layer and a second curved wire bond, wherein the second vertical bond wire emerges from a second matrix.

In Example 3, the subject matter of any one or more of Examples 1-2 optionally include a third memory module stacked below the subsequent memory module and above and on the second memory module, and coupled to the bond-wire board through a third vertical bond wire, a third redistribution layer and a third curved wire bond, wherein the third vertical bond wire emerges from a third matrix.

In Example 4, the subject matter of any one or more of Examples 1-3 optionally include a second memory module stacked above and on the first memory module, and coupled to the bond-wire board through a second vertical bond wire, a second redistribution layer and a second curved wire bond, wherein the second vertical bond wire emerges from a second matrix; a third memory module stacked below and on the subsequent memory module, and coupled to the bond-wire board through a third vertical bond wire, a third redistribution layer and a third curved wire bond, wherein the third vertical bond wire emerges from a third matrix; and wherein the first and second memory modules are wire bonded with the first and second wire bonds, to a first edge of the bond-wire board, and wherein the third and subsequent memory modules are wire bonded with the third and subsequent curved wire bonds to an edge of the bond-wire board other than the first edge.

In Example 5, the subject matter of Example 4 optionally includes wherein the second memory module is stair-step stacked on the first memory module, and wherein the subsequent memory module is stair-step stacked on the third memory module.

In Example 6, the subject matter of Example 5 optionally includes wherein the first memory module includes four NAND memory dice, the second memory module includes four NAND memory dice, the third memory module includes four NAND memory dice, the subsequent memory module includes four NAND memory dice, and wherein each memory die is coupled to a corresponding redistribution layer by a vertical bond wire.

In Example 7, the subject matter of any one or more of Examples 1-6 optionally include further: wherein the first memory module includes a first plurality of stacked memory dice coupled to the first redistribution layer by a first plurality of vertical bond wires; and wherein the subsequent memory module includes a subsequent plurality of stacked memory dice coupled to the subsequent redistribution layer by a subsequent plurality of bond wires.

In Example 8, the subject matter of any one or more of Examples 1-7 optionally include a board onto which the bond-wire board is mounted at a land side that is opposite the module side, wherein the board is part of a computing system.

In Example 9, the subject matter of any one or more of Examples 1-8 optionally include wherein the first memory module vertical bond wire is arranged opposite to the subsequent memory module vertical bond wire.

In Example 10, the subject matter of any one or more of Examples 1-9 optionally include wherein the first memory module is arranged orthogonal to the subsequent memory module.

In Example 11, the subject matter of any one or more of Examples 1-10 optionally include wherein the first memory module is arranged orthogonal to the subsequent memory module, wherein a second memory module is arranged side-by-side on the bond-wire board, wherein a third and a forth memory module are stacked side-by-side on the first and second memory modules, wherein a fifth and six memory module are stacked side-by-side on the third and fourth memory modules, and wherein a seventh and the subsequent memory module are stacked side-by-side on the fifth and sixth memory modules.

Example 12 is a process of assembling a package-in-package, comprising: assembling a stair-stacked memory-die stack on a carrier; assembling a spacer to the memory-die stack; wire bonding from exposed portions of the memory-die stack onto the spacer; contacting a matrix precursor to the wire bond and to the memory-die stack; removing some of the matrix precursor to form a matrix and to create vertical bond wire tips that extend from the matrix; assembling a redistribution layer to the memory-die stack; and wire bonding a curved wire bond from the redistribution layer to a bond-wire board.

In Example 13, the subject matter of Example 12 optionally includes curing the matrix precursor.

In Example 14, the subject matter of any one or more of Examples 12-13 optionally include testing the memory-die stack to determine a first known good module.

In Example 15, the subject matter of any one or more of Examples 12-14 optionally include curing the matrix precursor; removing the carrier, wherein the carrier is a glass carrier; and testing the memory-die stack to determine a known good module.

In Example 16, the subject matter of any one or more of Examples 12-15 optionally include wherein the wire bonding is a first wire bonding, further including: assembling a subsequent known good module above the first known good module; and wire bonding a subsequent curved wire bond from the subsequent known good module to the bond-wire board.

In Example 17, the subject matter of any one or more of Examples 12-16 optionally include wherein the wire bonding is a first wire bonding, further including: assembling a second known good module above and on the first known good module; wire bonding a second curved wire bond from the second known good module to the bond-wire board; assembling a third known good module above and on the second known good module; wire bonding a third curved wire bond from the third known good module to the bond-wire board; and assembling a subsequent known good module above and on the third known good module; wire bonding a subsequent curved wire bond from the subsequent known good module to the bond-wire board.

In Example 18, the subject matter of any one or more of Examples 12-17 optionally include assembling at least one semiconductor device adjacent the spacer.

Example 19 is a computing system, comprising: a first memory module coupled to a bond-wire board through a first vertical bond wire, a first redistribution layer and a first curved wire bond, wherein the first vertical bond wire emerges from a first matrix; a second memory module stacked on the first memory module and coupled to the bond-wire board through a second vertical bond wire, a second redistribution layer and a second curved wire bond, wherein the second vertical bond wire emerges from a second matrix; a third memory module stacked below the subsequent memory module and coupled to the bond-wire board through a third vertical bond wire, a third redistribution layer and a third curved wire bond, wherein the third vertical bond wire emerges from a third matrix; a subsequent memory module coupled to the bond-wire board through a subsequent vertical bond wire, a subsequent redistribution layer and a subsequent curved wire bond, wherein the subsequent vertical bond wire emerges from a subsequent matrix; an encapsulation that covers the first and subsequent memory modules, the first and subsequent curved wire bonds, and a module side of the bond-wire board; wherein the first and second memory modules are wire bonded with the first and second wire bonds, to a first edge of the bond-wire board, and wherein the third and subsequent memory modules are wire bonded with the third and subsequent curved wire bonds to an edge of the bond-wire board other than the first edge; and a board onto which the bond-wire board is mounted, wherein the board includes an external shell.

In Example 20, the subject matter of Example 19 optionally includes wherein the first memory module is arranged orthogonal to the subsequent memory module.

In Example 21, the subject matter of any one or more of Examples 19-20 optionally include a memory-controller hub disposed adjacent the first spacer, wherein the memory-controller hub is coupled to the first redistribution layer.

In Example 22, the subject matter of any one or more of Examples 19-21 optionally include wherein the computing system includes a chipset coupled to the first memory module.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described.

However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A package-in-package apparatus comprising:
    a first memory module coupled to a bond-wire board through a first vertical bond wire, a first redistribution layer and a first curved wire bond, wherein the first vertical bond wire includes a wire bond bead at a first end, and emerges from a first matrix at a second end;
    a subsequent memory module disposed above the first memory module and coupled to the bond-wire board through a subsequent vertical bond wire, a subsequent redistribution layer and a subsequent curved wire bond, wherein the subsequent vertical bond wire emerges from a subsequent matrix; and
    an encapsulation that covers the first and subsequent memory modules, the first and subsequent curved wire bonds, and a module side of the bond-wire board.

2. The memory apparatus of claim 1, further including a second memory module stacked above and on the first memory module, and coupled to the bond-wire board through a second vertical bond wire, a second redistribution layer and a second curved wire bond, wherein the second vertical bond wire emerges from a second matrix.

3. The memory apparatus of claim 2, further including a third memory module stacked below the subsequent memory module and above and on the second memory module, and coupled to the bond-wire board through a third vertical bond wire, a third redistribution layer and a third curved wire bond, wherein the third vertical bond wire emerges from a third matrix.

4. The memory apparatus of claim 1, further including:
    a second memory module stacked above and on the first memory module, and coupled to the bond-wire board through a second vertical bond wire, a second redistribution layer and a second curved wire bond, wherein the second vertical bond wire emerges from a second matrix;
    a third memory module stacked below and on the subsequent memory module, and coupled to the bond-wire board through a third vertical bond wire, a third redistribution layer and a third curved wire bond, wherein the third vertical bond wire emerges from a third matrix; and
    wherein the first and second memory modules are wire bonded with the first and second wire bonds, to a first edge of the bond-wire board, and wherein the third and subsequent memory modules are wire bonded with the third and subsequent curved wire bonds to an edge of the bond-wire board other than the first edge.

5. The package-in-package apparatus of claim 4, wherein the second memory module is stair-step stacked on the first memory module, and wherein the subsequent memory module is stair-step stacked on the third memory module.

6. The package-in-package apparatus of claim 5, wherein the first memory module includes four NAND memory dice, the second memory module includes four NAND memory dice, the third memory module includes four NAND memory dice, the subsequent memory module includes four NAND memory dice, and wherein each memory die is coupled to a corresponding redistribution layer by a vertical bond wire.

7. The package-in-package apparatus of claim 1, further:
    wherein the first memory module includes a first plurality of stacked memory dice coupled to the first redistribution layer by a first plurality of vertical bond wires; and
    wherein the subsequent memory module includes a subsequent plurality of stacked memory dice coupled to the subsequent redistribution layer by a subsequent plurality of bond wires.

8. The package-in-package apparatus of claim 1, further including:
    a board onto which the bond-wire board is mounted at a land side that is opposite the module side, wherein the board is part of a computing system.

9. The package-in-package apparatus of claim 1, wherein the first memory module vertical bond wire is arranged opposite to the subsequent memory module vertical bond wire.

10. A computing system, comprising:
    a first memory module coupled to a bond-wire board through a first vertical bond wire, a first redistribution layer and a first curved wire bond, wherein the first vertical bond wire includes a wire bond bead at a first end, and emerges from a first matrix at a second end;
    a second memory module stacked on the first memory module and coupled to the bond-wire board through a second vertical bond wire, a second redistribution layer and a second curved wire bond, wherein the second vertical bond wire emerges from a second matrix;
    a third memory module stacked below the subsequent memory module and coupled to the bond-wire board through a third vertical bond wire, a third redistribution layer and a third curved wire bond, wherein the third vertical bond wire emerges from a third matrix;

a subsequent memory module coupled to the bond-wire board through a subsequent vertical bond wire, a subsequent redistribution layer and a subsequent curved wire bond, wherein the subsequent vertical bond wire emerges from a subsequent matrix;

an encapsulation that covers the first and subsequent memory modules, the first and subsequent curved wire bonds, and a module side of the bond-wire board;

wherein the first and second memory modules are wire bonded with the first and second wire bonds, to a first edge of the bond-wire board, and wherein the third and subsequent memory modules are wire bonded with the third and subsequent curved wire bonds to an edge of the bond-wire board other than the first edge; and a board onto which the bond-wire board is mounted, wherein the board includes an external shell.

11. The computing system of claim 10, further including a memory-controller hub disposed adjacent a first spacer, wherein the memory-controller hub is coupled to the first redistribution layer.

12. The computing system of claim 10, wherein the computing system includes a chipset coupled to the first memory module.

* * * * *